(12) United States Patent
Hull et al.

(10) Patent No.: US 7,411,401 B1
(45) Date of Patent: Aug. 12, 2008

(54) SYSTEMS AND METHODS FOR REDUCING COMMON-MODE PLATFORM NOISE IN ELECTRIC-FIELD SENSORS

(75) Inventors: David M. Hull, Adelphi, MD (US); Mark R. Probst, Gaithersburg, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 11/514,980

(22) Filed: Sep. 5, 2006

Related U.S. Application Data

(60) Provisional application No. 60/174,182, filed on Sep. 2, 2005.

(51) Int. Cl.
G01R 29/08 (2006.01)
G01R 31/02 (2006.01)

(52) U.S. Cl. ......................................... 324/457; 324/72
(58) Field of Classification Search ................. 324/457, 324/72
See application file for complete search history.

(56) References Cited

U.S. PATENT DOCUMENTS

| | | | | |
|---|---|---|---|---|
| 3,458,805 A | * | 7/1969 | Kasemir | 324/72 |
| 3,873,919 A | * | 3/1975 | Vosteen | 324/72 |
| 4,183,303 A | | 1/1980 | Krupen | 102/211 |
| 4,197,737 A | * | 4/1980 | Pittman | 73/178 R |
| 4,205,267 A | * | 5/1980 | Williams | 324/458 |
| 4,291,627 A | | 9/1981 | Ziemba et al. | 102/265 |
| 4,972,775 A | | 11/1990 | Hoyt et al. | 102/211 |
| 4,991,508 A | | 2/1991 | Ziemba | 102/211 |
| 5,094,054 A | | 3/1992 | Arends | 52/302 |
| 5,252,912 A | | 10/1993 | Merritt et al. | 324/72 |
| 5,554,973 A | | 9/1996 | Kawashima et al. | 340/562 |
| 5,726,581 A | | 3/1998 | Vranish | 324/688 |
| 6,196,054 B1 | | 3/2001 | Okamura et al. | 73/35.08 |
| 6,196,130 B1 | | 3/2001 | Crist et al. | 102/221 |

* cited by examiner

*Primary Examiner*—Vincent Q Nguyen
(74) *Attorney, Agent, or Firm*—Edward L. Stolarun; Guy M. Miller

(57) ABSTRACT

Systems and methods for reducing electrostatic platform noise in electric-field sensors due to various self-charging and discharging processes are provided. A representative method includes: identifying avoidance regions of an electrostatically-floating sensor platform that have a propensity for self-induced charging and discharging; locating a first electrode and a second electrode on the electrostatically-floating sensor platform, wherein the first electrode and the second electrode are positioned and dimensioned to receive substantially equal amounts of distributed charge via self-charging; and obtaining a differential signal from these two electrodes that is proportional to an external ambient E-field of interest, while at the same time nulling out the common-mode signal that results from sensor platform self-charging and/or discharging.

17 Claims, 5 Drawing Sheets

SYSTEMS AND METHODS FOR REDUCING COMMON-MODE PLATFORM NOISE IN ELECTRIC-FIELD SENSORS

CROSS-REFERENCE TO RELATED APPLICATION

This application claims priority to co-pending U.S. provisional application entitled, "Systems for Electrostatic Proximity Detection and Methods for Producing Same," having Ser. No. 60/174,182, filed Sep. 2, 2005, which is entirely incorporated herein by reference.

STATEMENT REGARDING FEDERALLY SPONSORED RESEARCH OR DEVELOPMENT

The invention described herein may be manufactured, used, and licensed by or for the United States Government.

TECHNICAL FIELD

The present disclosure is generally related to electrostatic field sensing.

BACKGROUND

Electric-field probes such as those used on electrostatically-floating sensor platforms, e.g. projectiles, typically are subject to electrical noise and signal drift. The electrical noise and signal drift usually are caused by a distributed charge as the charge accumulates and moves on such a projectile. For instance, a projectile in flight will charge due to triboelectrification or frictional contact with particles in the air. Combustion processes also can increase charge accumulation. These processes result in electrostatic charges attaching to the surface of the projectile while opposite charges are pulled away from the projectile by particles of a different material or by ions having different charge mobilities. As a conducting body accumulates charge, the charge redistributes itself according to Poisson's equation and the electrostatic boundary conditions; that is, according to the shape of the projectile. For example, triboelectrification may occur primarily on the nose, but some of the resultant charges will immediately move to the tail.

Charging is a cumulative process during flight and, at some point, the accumulated charge on the projectile becomes great enough that a counter-balancing discharging process begins. Areas typically experiencing higher charge density accumulation include those areas having high curvature and those at the extremities of the projectile. When the charge density becomes high enough, discharging begins. For example, discharging through corona can occur. These charging and discharging processes do not occur at all points over the surface of the projectile, but rather in particular areas. At some point, the average discharging current may equal the average charging current, and the total charge on the projectile may reach equilibrium. However, the instantaneous charging and discharging currents are rarely equal, even in equilibrium. In addition, an average current typically flows from the charging points to the discharging points, even in equilibrium. Unfortunately, the charging and discharging processes can generate significant amounts of electrical noise and can cause signal drift in an electric-field probe that is integrated into the projectile and used for electrostatic proximity detection.

SUMMARY

Systems and methods for reducing common-mode platform noise in electric-field sensors are provided. In this regard, an exemplary embodiment of such a system comprises a first electrode and a second electrode electrically insulated from the first electrode. The first electrode and the second electrode are positioned and dimensioned to receive substantially equal amounts of distributed charge via self-charging. These electrodes may also be used with a third (common) electrode in order to isolate the sensor electrodes from most charging and discharging currents.

An exemplary embodiment of a method for performing electrostatic proximity detection, comprises: identifying avoidance regions of an electrostatically-floating sensor platform that have a propensity for self-induced charging and discharging; locating a first electrode and a second electrode on the electrostatically-floating sensor platform, wherein the first electrode and the second electrode are positioned and dimensioned to receive substantially equal amounts of distributed charge via self-charging. In some embodiments, the following additional steps can be performed: electrically connecting the remainder of the platform, including all of the avoidance regions, to form a common electrode (also referred to as chassis ground), and then mechanically isolating and electrically connecting the two sensor electrodes to a differential amplifier. In this way, the sensor can be used to detect the desired external electric field while remaining insensitive to the unwanted effects of the local platform charging and discharging processes.

BRIEF DESCRIPTION OF THE DRAWINGS

Many aspects of the disclosure can be better understood with reference to the following drawings. The components in the drawings are not necessarily to scale. Moreover, in the drawings, like reference numerals designate corresponding parts throughout the several views.

DETAILED DESCRIPTION

In the description that follows, the terms "electric field" and "E-field" will be used to describe a quasi-static field that results from the presence and/or motion of electric charges. The terms "shell" and "projectile" are used to describe a specific embodiment of an electrostatically-floating E-field sensor platform. The terms "sensor electrodes" and "sensor elements" and "probe" are used to describe electrically-conducting portions of an E-field sensor that are exposed to a quasi-static field and used to provide a low-level current or voltage signal that can be amplified, filtered and/or processed as part of an E-field sensor. The specific embodiments described in detail below relate to a projectile-based electrostatic proximity sensor; however, this invention is by no means limited to this specific application.

In this regard, electric-field (or E-field) sensing may be used to provide a means of electrostatic proximity detection on electrically-floating sensors that are integrated into projectiles. Airborne or ground-based E-field sensors may also be used to investigate atmospheric E-fields resulting from space charges (e.g., charged dust and/or precipitation, thunderclouds, and lightning precursors). E-field sensors may be used in surveillance sensing to detect intruders, or on assembly lines to monitor and protect against electrostatic hazards.

Electrically-floating sensors can develop high levels of unwanted electrostatic charge due to self-charging processes, including triboelectrification (frictional charging) and combustion charging (e.g., due to a motor or tracer). It is, therefore, desirable to build E-field sensors that are insensitive to platform charging and discharging processes, and yet are still sensitive to E-fields caused by external objects of interest.

Figure 1:
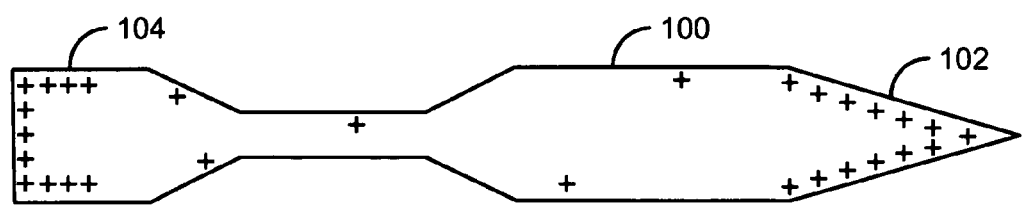
FIG. 1 is a schematic diagram of an embodiment of an electrostatically-floating sensor platform showing a representative distributed charge.

Referring now to the figures, FIG. 1 is an illustration of an exemplary distributed charge distribution on an embodiment of an electrostatically-floating sensor platform. In FIG. 1, the projectile charge is shown as being positive; however, it is noted that the charge may be negative.

In this embodiment, the electrostatically-floating sensor platform is a projectile 100 designed to be fired at a target (not shown). Although discussed in terms of a projectile 100, one of ordinary skill in the art will appreciate that these concepts can be applied to many electrostatically-floating sensor platforms, including, but not limited to aircraft, rockets, laboratory devices, and industrial devices. The distributed charge due to self-charging reflects a net charge on the projectile 100. As illustrated, the distributed charge accumulates in greater densities at the extremities and locations of high angular curvature. For example, higher charge densities will occur in regions 102 and 104, respectively, of the projectile 100. This electric monopole charge distribution is fundamentally different from a charge distribution due to an external field, which is an induced electric dipole charge distribution having no net charge when integrated over the entire projectile.

Figure 2:
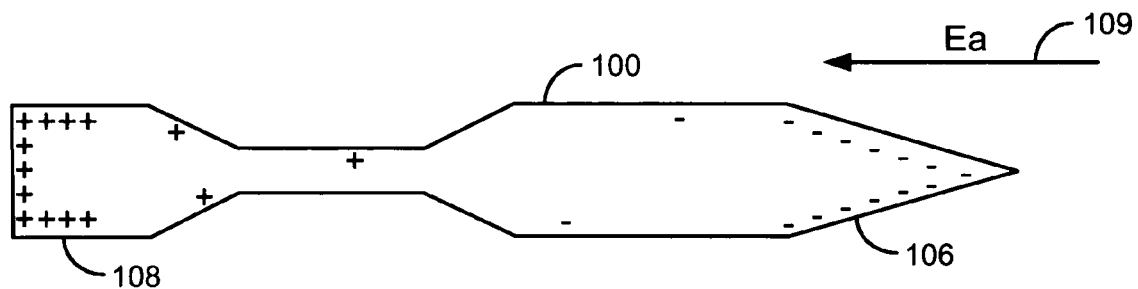
FIG. 2 is a schematic diagram of an embodiment of an electrostatically-floating sensor platform showing a representative induced charge due to an external electric-field.

As seen in FIG. 2, which is an illustration of an exemplary electric-field induced charge distribution on an electrostatically-floating sensor platform, the net charge on the projectile 100 due to the electric field ($E_a$) 109 is substantially zero. For example, in the case of an induced charge due to an external field oriented opposite to the direction of the projectile, the front extremities 106 experience a negative charge and the rear extremities 108 experience an equal and opposite positive charge.

In FIG. 2, the external E-field is aligned with the axis of the projectile; this is for clarity of the figure. It is noted that if the sensor elements are axially-symmetric, then the sensor will only respond to the axial component of the external field, and so this figure illustrates that common geometry. It is also noted that the direction of the external field can be reversed; in this case, the signs of the induced charge are reversed, but the differential nature of the induced charge is not changed.

Unlike the induced charge, which results in no net charge on the projectile 100 as shown in FIG. 2, the distributed self-charge is of a single sign, and can accumulate to a level that precipitates discharging processes such as corona. Corona typically occurs at sharp points near the extremities of the projectile where the net charge density is the greatest. This discharging current is very impulsive, and can result in considerable noise being induced into the electronics associated with an electrostatic proximity sensor. Additionally, discharging currents typically do not occur in exactly the same places on the projectile as do charging currents, and so a net current may flow on the shell from charging to discharging points. This current can introduce significant signal offset and drift into the sensor electronics.

In order to avoid the noise and potential signal drift associated with the charging and discharging processes, a differential probe is provided that isolates the inputs of two sensor electrodes from this noise by utilizing a third or "common" electrode. In this manner, the projectile is divided into three electrically isolated parts that include a first sensor electrode, a second sensor electrode, and a common electrode. Typically, the common electrode will include the outer portions of the projectile that are most likely to be a source (or sink) of charging (or discharging) currents.

Figure 3:
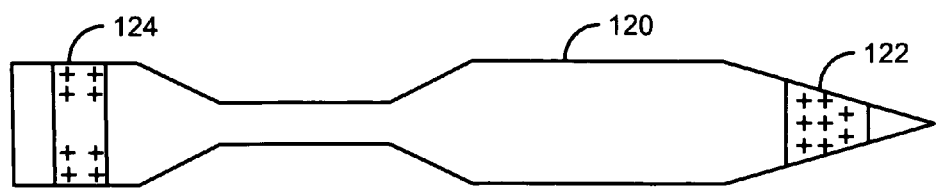
FIG. 3 is an exemplary schematic diagram of an embodiment of a projectile mounted dual-ring electric-field probe showing a representative distributed charge.

Reference is now made to FIG. 3, which is an illustration of an exemplary distributed charge on another embodiment of an electrostatically-floating sensor platform. As shown in FIG. 3, the platform (projectile 120) includes an embodiment of a dual-ring electric-field probe. The front and rear electrodes 122 and 124 of the dual-ring probe are ideally located such that the distributed charge is equally (or essentially equally) applied to each of the two electrodes 122 and 124. In this manner, the common-mode signal coming from these two sensor electrodes will be equal, and will automatically cancel in a differential amplifier.

The positions of these electrodes (e.g., rings) are chosen to avoid the tips of the nose and tail where charging and discharging are likely to occur, and the size (specifically, the surface area) is chosen so that the same amount of charge due to the projectile self-charging exists on each electrode. We have used computer models based on the Method of Moments to determine both the self-charge and induced-charge distributions on the projectile. It is noted that other numerical methods (e.g., the Finite Element Method) and/or laboratory measurements on physical models can be used to adjust the electrode areas until the common charge is equal.

Figure 4:
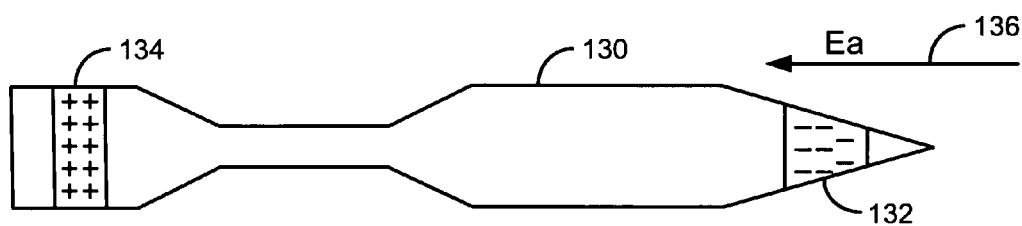
FIG. 4 is an exemplary schematic diagram of an embodiment of a projectile mounted dual-ring electric-field probe showing a representative electric-field induced charge.

Reference is now made to FIG. 4, which is an illustration of an exemplary induced charge on the same embodiment of an electrostatically-floating sensor platform due to an external electric field $E_a$. As shown in FIG. 4, the platform (projectile 130) includes an embodiment of a dual-ring electric-field probe. The projectile 130 includes a front sensor electrode 132 and a rear sensor electrode 134, each of which is configured as a ring. In this embodiment, the electrodes also are sized and positioned so that the difference between the induced charges on the two electrodes is increased, e.g. maximized. In this manner, probe gain is increased. This step (maximizing the differential charge induced by an external field) must be done at the same time (or iteratively) with the previous step (which equates the effect of self-charging on each electrode). For example, two probe positions are chosen such that regions of platform charging and discharging are avoided, the areas are adjusted until the common-mode charge is equal (and the self-charging shows up as a common-mode signal), and the differential signal is evaluated. If the signal due to the external field is not large enough, then the size of both electrodes may need to be increased, or the positions may need to be adjusted to provide a greater differential signal.

Figure 6:
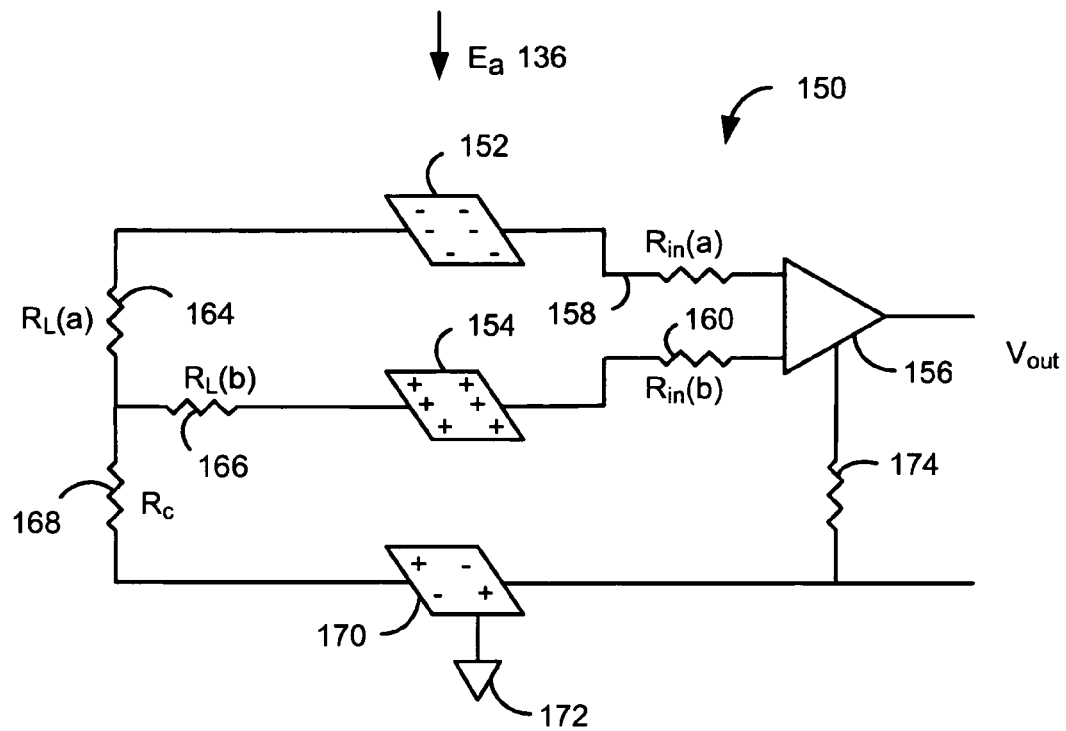
FIG. 6 is a schematic diagram of an exemplary circuit for generating a high differential gain using a dual-ring electric-field probe on a projectile.

It is noted that the total charge on the shell is a linear combination of the self-charge shown in FIG. 3 and the induced charge shown in FIG. 4. The charge induced by the electric field 136 does not reflect a net change in total charge. For example, the front sensor electrode 132 is negatively charged as a result of the electric field 136, while the rear sensor electrode 134 is positively charged by the electric field 136. The positions of these rings are chosen to maximize the distributed charge that is induced between the two sensor electrodes by the external fields, while avoiding the regions likely to be involved in self-charging and discharging processes. It is noted that the distributed charge on the two sensor electrodes (or sensor elements) due to self-charging processes should be equal (as shown in FIG. 3). However, the induced charge on the two elements due to an external E-field to be sensed should not be equal (and may even be of opposite sign) as shown in FIG. 4 and FIG. 6, or as the common-mode charge shown in FIG. 7.

The induced charges are proportional to the external electric field. Moving through a (non-uniform) external field causes the induced charges to change, which results in a sensor current. This current is proportional to the time-derivative of the external field. By comparing the voltages or currents generated by the induced charge in each of the sensor electrodes 132, 134, proximity to a charged target that generates the electric field 136 can be determined.

Figure 5:
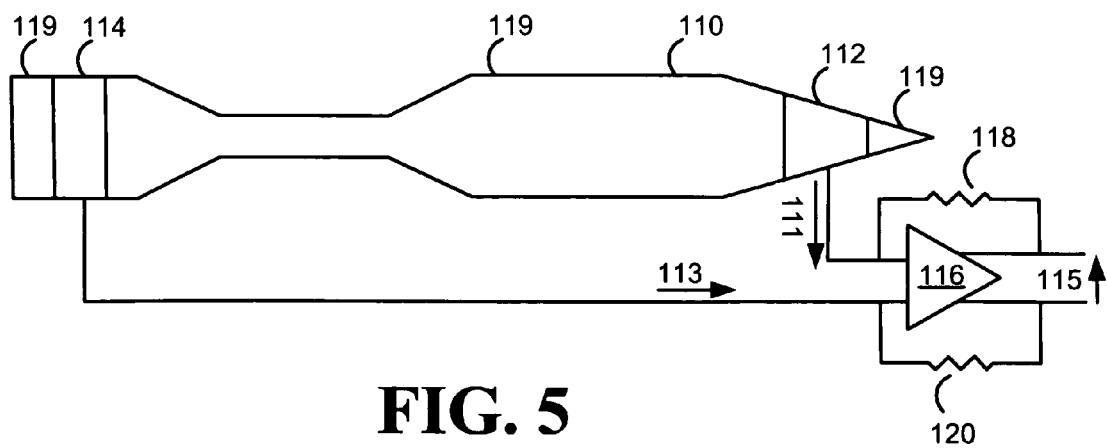
FIG. 5 is a schematic diagram of an embodiment of a projectile-mounted dual-ring electric-field probe connected to a basic differential current amplifier circuit.

Reference is now made to FIG. 5, which is an embodiment of a basic differential current amplifier circuit connected to a dual-ring electric-field probe on a projectile. The projectile 110 includes a front sensor electrode 112 and a rear sensor electrode 114. The front and rear sensor electrodes 112 and 114 generate induced charge currents 111 and 113. When the sensor electrodes 112 and 114 are connected to the inputs of a differential amplifier 116 (shown in FIG. 5 as a trans-resistance amplifier), a differential output voltage 115 is generated corresponding to the difference between the induced charge currents of the front and rear sensor electrodes 112 and 114. In this manner, the influence of the distributed self-charge can be diminished because the configuration of the sensor electrodes 112 and 114 balances the effect on each electrode as a common-mode signal. While the self-charge effect is isolated as a common-mode signal, the induced charge is manifested as a differential signal that can be utilized to determine proximity to the target.

In particular, the differential amplifier 116 causes the input current(s) (e.g., 111 and 113) to flow through the feedback resistors (e.g., 118 and 120), creating a differential voltage $V_{out} = i_1 R_1 - i_2 R_2$. In an actual implementation, there may be additional connections (power and circuit ground, possibly other inputs and external circuitry to null out input offset currents, etc.). There also may be other components such as input resistors (shown as 158 and 160 in FIG. 6), RF chokes (to prevent RF energy from coupling into the circuit), capacitors (for low-pass and/or high-pass filtering), etc. These components are not shown for ease of illustration in this embodiment.

Although the sensor electrodes 112 and 114 are illustrated as being electrically isolated or "floating" with respect to the outer shell of the projectile, the entire projectile should remain at the same potential for an induced-current sensor to work properly. Thus, the outer surface of the projectile is treated as a third or "common" electrode 119. If the entire projectile, including the common electrode and the sensor electrodes 112 and 114, does not remain at the same potential, two problems can occur. First, a change in the conditions at the boundary between the sensor electrodes 112 and 114 and the common electrode 119 can cause the probe to behave differently than in a constant-potential case. For example, extra charges on the common electrode 119 can induce charges and thus currents on the two sensor electrodes 112 and 114. The additional charges and currents will result in adding an unwanted and unpredictable signal. Second, if the potential between either of the two sensor electrodes 112 and 114 and the common electrode 119 becomes greater than the breakdown strength of the dielectric separating the electrodes 112, 114, and 119, then electrostatic discharge can occur.

In addition to being noisy, the direct injection of current into the differential current amplifier 116 due to electrostatic discharge could damage the electronic components of the projectile 110. For these reasons, leakage resistors (not shown) can be placed between each of the sensor electrodes 112 and 114 and the common electrode 119. Note that the common electrode 119 includes substantially all of the non-sensor electrode surfaces of the projectile 110. For example, the common electrode 119 includes the rear portion 121, the center portion 122 and the front portion 123, such that all three portions are electrically shorted together.

Reference is now made to FIG. 6, which is a schematic diagram of an exemplary circuit for generating improved differential gain using a dual-ring electric-field probe on a projectile. This figure also shows a differential charge induced on two sensor electrodes by an external electric field $E_a$ (136). The circuit 150 includes sensor electrodes, 152 and 154, which produce charge currents corresponding to an electric field. Within the circuit, the remaining surface areas of the projectile are configured as a common electrode 170, which is shown as being electrically grounded to the projectile chassis 172.

Since the entire outer shell including the sensor electrodes 152 and 154 and the common electrode 170 should remain at the same potential for an electrostatic current sensor, leakage resistors 164 and 166 are interconnected between each sensor electrode 152 and 154 and the common electrode 170. The leakage resistors 164 and 166 are preferably sized to be large compared to the amplifier input resistors 158 and 160. In this manner, all of the electrodes 152, 154 and 170 maintain the same electrical potential and the leakage current should be substantially small enough to have a negligible effect on sensor performance. Additionally, the leakage resistors 164 and 166 should be precisely matched, using, for example, resistors configured within a one percent tolerance. Even a one percent error in resistance match, however, can result in some projectile charging or discharging currents appearing at the differential inputs of the amplifier 156.

To further improve the match corresponding to the distributed charge currents, the amplifier input resistors 158 and 160 can be adjusted to further balance the unwanted currents resulting from projectile charging and discharging processes. Additionally, matching the leakage resistances 164 and 166 can be improved by using a common resistor 168 in combination with lower value leakage resistors 164 and 166.

The amplifier 156 receives differential inputs through the amplifier input resistors 158 and 160. Additionally, the amplifier 156 can include a single ground connection to the projectile body through an external resistor 174 to keep the electronics from charging up relative to the shell during normal operation. The amplifier circuit 150 as shown is a differential current amplifier, which amplifies the difference between the currents generated by the first electrode 152 and the second electrode 154. The output voltage $V_{out}$ is proportional to the difference between these input currents induced by the external field, whereas no common-mode signal is generated from the projectile charging and discharging currents.

Figure 7:
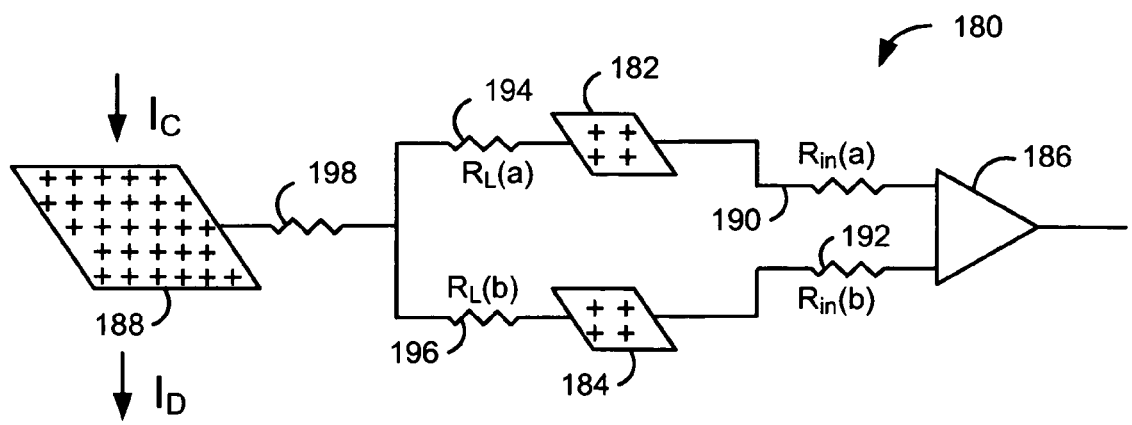
FIG. 7 is an exemplary schematic of a circuit that illustrates the distributed charge on the sensor electrodes and the common electrode, in which the sensor electrodes have been balanced so that the effects of this charge are seen as a common-mode signal at the differential amplifier.

Reference is now made to FIG. 7, which illustrates the distributed charge on the sensor electrodes and the common electrode due to projectile charging and discharging processes. The circuit 180 includes sensor electrodes 182 and 184 resistively coupled to an amplifier 186 through input resistors 190 and 192, respectively. Additionally, the sensor electrodes 182 and 184 are resistively coupled to a common electrode 188 through leakage resistors 194 and 196, respectively, in combination with a common resistor 198. As discussed above, the resistive coupling between the sensor electrodes 182 and 184 and the common electrode 188 serves to maintain a common potential between all of the electrodes. The resistors are matched to minimize the common-mode currents associated with the projectile charging and discharging processes.

The effectiveness of the resistive coupling is limited by the configuration of the sensor electrodes 182 and 184. For example, the sensor electrodes 182 and 184 are assumed to be positioned and configured so that all projectile charging currents ($I_C$) and discharging currents ($I_D$) flow on and off the common electrode 188. Because of the size of the common electrode 188 relative to the sensor electrodes 182 and 184, most of the resulting charge may stay on the common electrode 188. However, some of this self-charge will accumulate on the sensor electrodes 182 and 184 as well. The size and position are balanced so that this charge is seen as a common-mode signal at the amplifier. In order to balance the resulting currents as well, the values of the leakage resistors should also be matched to prevent the distributed charge currents from entering the differential amplifier as a differential signal. Since, as discussed above, leakage resistor $R_L(a)$ 194 is approximately equal to leakage resistor $R_L(b)$ 196, the distributed charge currents can be further isolated by making the sum of leakage resistor $R_L(a)$ 194 and amplifier input resistor $R_{in}(a)$ 190 equal the sum of leakage resistor $R_L(b)$ 196 and amplifier input resistor $R_{in}(b)$ 192, as described in the following equation.

$$R_L(a)+R_{in}(a)=R_L(b)+R_{in}(b)$$

In this way, the input resistors can be used as trimming resistors to further balance the unwanted common-mode signal.

Normally, the induced currents caused by $dE_n/dt$ as a result of moving through an electric field 185 are on the order of nanoamps. Since the leakage resistors are much larger than the input resistors (such as by 100 times or larger), the leakage currents are normally in the picoamp range. For example, leakage resistors 194 and 196 valued at 1 MΩ result in voltages on the order of microvolts between the sensor electrodes 182 and 187 and the common electrode 188 for leakage currents on the order of picoamps. Even with higher peak currents from corona, the potential difference should be negligible.

Regarding the magnitude of the distributed charge currents, estimates put the steady-state, clean-air charging/discharging currents between 100 nA to 1 μA. It has been approximated that three percent of this current flows onto each of the sensor electrodes 182 and 184 for one embodiment studied in detail (see FIG. 9). The charging currents due to flight through rain, dust, etc. are likely to be significantly greater than this. Further, the distributed charge in an aggressive environment, such as during a gun launch, can result in charging currents on the order of 30 μA. In this case, the charging current to the sensor electrodes 182 and 184 of approximately three percent of the net current is approximately 1 μA. Where the leakage resistors 194 and 196 are balanced to one percent, the current into the amplifier 186 is approximately 10 μA. Comparatively, corona discharge currents are very impulsive, with peak values typically ranging between 5 and 50 mA. Where approximately three percent of the discharge current is flowing to the sensor electrodes 182 and 184 and one percent of that value shows up as a differential signal, then the differential signal currents should be on the order of 10 μA. Clearly, unwanted common-mode signals from shell charging and discharging processes are significant, and therefore means to reduce these currents by orders of magnitude are important.

Figure 8:
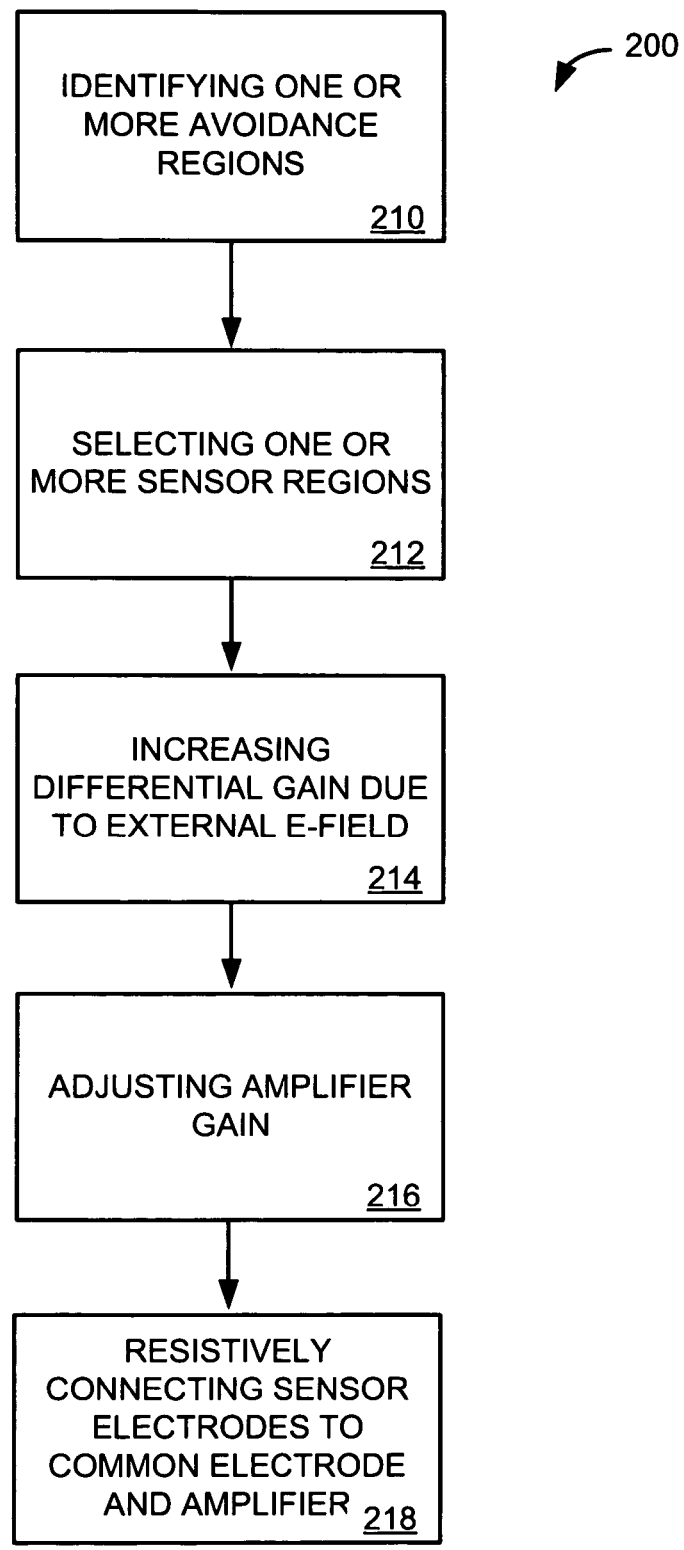
FIG. 8 is a block diagram illustrating a method for producing a differential electric-field probe for a projectile.

Reference is now made to FIG. 8, which is a block diagram illustrating a method for producing a differential electric-field probe for an electrostatically-floating sensor platform. The electrostatically-floating sensor platform can include, but is not limited to, a projectile, a rocket, an aircraft, a laboratory platform, or an industrial platform, among others. For example, when used in the context of a projectile, the probe can be used to detect proximity to a target. Alternatively, where mounted on an aircraft, the probe can be designed to measure atmospheric fields for scientific study and/or for lightning protection. Additionally, aircraft mounted probes can be designed to detect power line fields for wire avoidance applications or to measure fields near a cargo hook for safety during material handling. In a laboratory or industrial setting, the probe can be used in processes to measure ambient fields or to detect space charges and/or charged objects and/or conductors in an ambient field. This utilization is especially effective when the sensor must be electrically isolated or when the fields or charges are such that any sensor charging and/or discharging processes could result in sensor noise.

The method 200 starts with identifying one or more avoidance regions in block 210. These regions are identified as those that are normally involved in charging or discharging processes. In the case of a projectile, typically, these regions include the front tip of the projectile as well as any stabilizing fins or parts of the projectile that provide drag since these are the areas where triboelectric charging occurs. Additionally, areas near a combustion exhaust, such as a tracer or rocket motor, are likely to be involved in combustion related charging. Further, any corners such as the front tip of the projectile and the rear edges of stabilizing fins are likely to be sources of corona discharge. All of these areas should be included as part of the common electrode.

Regions other than those identified in block 210 are ideally suited for locating the sensor electrodes. In order to further isolate the sensor electrodes from the environmental charging and discharging processes, it may be desirable to coat the sensor electrodes with an insulating material such as a flame-sprayed ceramic. While this may help reduce the potential for corona to occur on any edges or corners of the sensor electrodes, it must be emphasized that this is not a substitute for avoiding the areas where platform charging and discharging processes normally occur. In fact, insulators can trap surface charges that naturally build up until corona or other electrically-noisy discharging processes occur. Since opposite charges are induced on the sensor electrodes through the insulating material, this coating could even result in a sensor having higher electrical noise than a sensor containing uncoated electrodes.

The next step in the method 200 involves selecting one or more sensor regions in block 212. The sensor regions should be selected from those not involved in any charging or discharging processes. Additionally, the regions are preferably the same "effective size" electrostatically so that as the platform charges and/or discharges, equal charges flow onto each electrode during the charging and discharging. In this way, no differential current between the electrodes is observed. The "effective size" of each electrode is a complex function of the physical size and position on the platform. For example, electrodes near extremities of elongated bodies generally have larger effective sizes than electrodes of the same physical area near the center of those platforms. In these cases, the physical areas should be adjusted accordingly. In the case of two physically symmetrical electrodes, the areas will be equal. For example, in the case of a transverse sensor mounted on an axially-symmetric body like a projectile where the sensors naturally have symmetric electrodes to sense electric fields perpendicular to the projectile's axis, the electrodes can be the same size. In contrast, a longitudinal sensor on the same type of projectile can be configured as two different, but axially-symmetric, rings positioned with some axial distance between them. In general, these rings will not have the same diameter or the same physical area, but by making the electrodes the same electrostatic "effective size," no differential currents are induced between the electrodes as the projectile charges and discharges. The method can be similarly applied to spinning sensors, which may, for example, modulate the Earth's electrostatic field or any other DC field. In this manner, the field strength can be estimated such that a number of platform turns can be counted. An exemplary utilization of this application includes, for example, a projectile-based range-estimating sensor.

Next step in the method 200 includes increasing, e.g. maximizing, the differential gain between the active electrodes (sensors) in block 214. In general, this can be done by making the electrodes larger and/or by moving the electrodes farther apart. The size and position considerations for the electrodes, however, should not override the underlying concept of matching the effect of a distributed charge on each electrode. In practice, this step is accomplished with the previous step, or in an iterative manner, so that the differential signal is maximized while the common-mode signal is nulled out.

The fourth step in the method 200 is adjusting the amplifier gain in block 216. The amplifier gain is adjusted to compensate for any difference in sensor gain. For example, if the differential gain is twice the single-ended gain, the amplifier gain may need to be reduced. More commonly, the differential gain is less than the equivalent single-ended gain, and so the amplifier gain is increased in order to provide an equivalent output signal. While an increase in amplifier gain can result in additional circuit noise, the amplifier circuit noise is typically several orders of magnitude less than the environmental electrostatic noise. For this reason, the amplifier gain can typically be increased as needed without adding any appreciable noise to the sensor output. Ideally, two sensor electrodes are positioned such that the charges and currents induced by an external target are of equal and opposite sign, resulting in a +6-dB signal gain. In this case, if the common-mode noise is also reduced by 100× (40 dB), then an improvement in the signal-to-noise ratio (SNR) of +46 dB relative to a similarly-sized single electrode probe is possible.

In practice, the differential signal may be less than the signal using an unbalanced pair of sensor electrodes. If the electrodes must be closely spaced so that the signal due to the external field has a significant common-mode component (say 90%), then the differential signal may be less than with a traditional sensor (in this example, −20 dB), but a 20-dB improvement in SNR may still be observed (as long as the amplifier noise is small).

The next step in the method 200 includes resistively connecting sensor electrodes to the common electrode in block 218. A balanced resistor network is utilized to connect the sensor electrodes to the common electrodes so that as the entire platform charges and/or discharges, the potential of the sensor electrodes is allowed to float electrically with the rest of the sensor platform. By resistively connecting the sensor electrodes to the rest of the platform, the secondary (charge redistribution) currents keep the sensor electrodes at the same potential, yet are seen by the input amplifier as a purely common mode signal. If, in the alternative, the sensor electrodes are electrically isolated, then as the sensor platform charges (for example, as a result of self-charging currents during normal flight operations), the sensor electrodes will reach a high electrical potential with respect to the rest of the projectile. Moreover, platform charging may result in electrostatic discharge to the sensor electronics, an extremely noisy and even potentially destructive process. It is also important to balance these currents precisely so that no differential currents are generated that can result in a sensor output voltage. If the resistors are not balanced, then the common mode currents will not be balanced and a differential current will result. By properly balancing the resistor network, the secondary charge redistribution currents on the sensor platform show up as a common-mode signal that can be rejected by the input amplifier.

Figure 9:
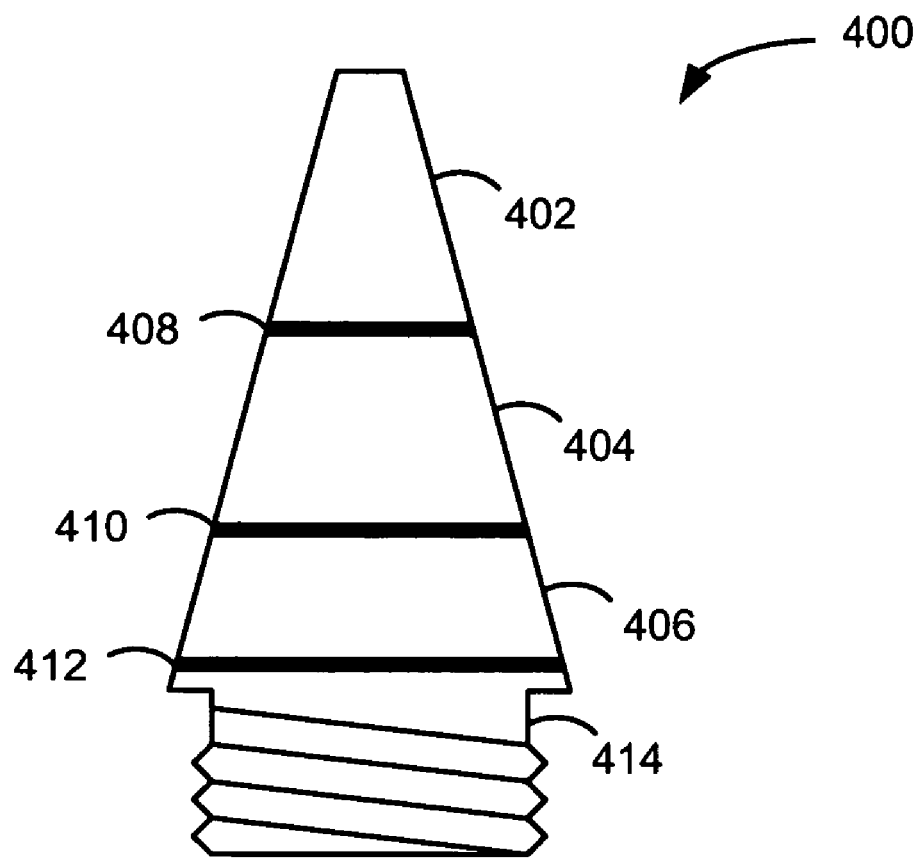
FIG. 9 is a schematic view of an embodiment of a dual-ring electric-field probe for attaching to a projectile.

Reference is now made to FIG. 9, which is a schematic view of an embodiment of a dual-ring electric-field probe for attaching to a projectile. The probe 400 includes a common electrode 402, which is located, in part, at the tip of the projectile where significant charging and discharging processes take place. The probe 400 also includes a first sensor electrode 404 and a second sensor electrode 406. The first and second sensor electrodes 404 and 406 are utilized to sense a changing electric field as the probe 400 nears a charged target. Between the common electrode 402 and the first electrode 404 and between the first electrode 404 and the second electrode 406 are insulators 408 and 410. Internally (not shown here) the first electrode 404 and the second electrode 406 are resistively coupled to the common electrode 402. Further, the body of the probe 414 is electrically shorted to the common electrode 402. Although not shown here, the common electrode 402 also includes the other surface areas of the projectile through the common electrical connection with the body of the probe 414.

An insulator 412 is also placed between the second electrode 406 and the body of the probe 414. Note that the length of the first electrode 404 is greater than the length of the second electrode 406 to provide similar electrode surface area and attain the same electrostatically "effective size". Although a probe of an embodiment is discussed in the context of a projectile, the concepts as disclosed herein are applicable to any number of electrostatically floating platforms including, but not limited to, a rocket, an aircraft, a laboratory platform, or an industrial platform, among others.

One should note that the flowcharts included herein depict representative implementations. In some alternative implementations, the functions noted in the blocks may occur out of the order in which they are depicted in the figures. For example, two blocks shown in succession may in fact be executed substantially concurrently or the blocks may sometimes be executed in the reverse order, depending upon the functionality involved.

It should be emphasized that many variations and modifications may be made to the above-described embodiments.

All such modifications and variations are intended to be included herein within the scope of this disclosure and protected by the following claims.

The invention claimed is:

1. A system for reducing common-mode platform noise in electric-field sensors, comprising:
   an electrostatically-floating sensor platform having sensor regions located away from regions on the electrostatically-floating sensor platform that have a propensity for self-induced chart;
   a first electrode; and
   a second electrode electrically insulated from the first electrode;
   wherein at least one of the first and second electrodes is positioned on the electrostatically-floating sensor platform within the sensor regions and wherein the first electrode and the second electrode are positioned and dimensioned on the electrostatically-floating sensor platform to receive substantially equal amounts of distributed charge via self-charging.

2. The system of claim 1, further comprising a differential amplifier operative to generate a differential signal responsive to inputs received from the first electrode and the second electrode.

3. The system of claim 2, further comprising means for generating a differential signal responsive to inputs received from the first electrode and the second electrode.

4. The system of claim 2, wherein the first electrode and the second electrode are positioned to maximize the differential signal.

5. The system of claim 1, further comprising a common electrode operative to isolate charging and discharging of the first electrode and the second electrode.

6. The system of claim 5, wherein each of the first electrode and the second electrode is also insulated from the common electrode.

7. The system of claim 5, wherein:
   the first electrode is electrically coupled to the common electrode through a first resistance; and
   the second electrode is electrically coupled to the common electrode through a second resistance.

8. The system of claim 7, wherein the first resistance is matched to the second resistance.

9. The system of claim 5, wherein the common electrode is electrically grounded to a body to which the first and second electrodes are mounted.

10. The system of claim 9, further comprising the body to which the electrodes are mounted.

11. A method for reducing common-mode platform noise in electric-field sensors, comprising:
    identifying avoidance regions of an electrostatically-floating sensor platform that have a propensity for self-induced charging and discharging; and
    locating a first electrode and a second electrode on the electrostatically-floating sensor platform, wherein at least one of the first and second electrodes is not located in any identified avoidance regions and wherein the first electrode and the second electrode are positioned and dimensioned to receive substantially equal amounts of distributed charge via self-charging.

12. The method of claim 11, further comprising comparing at least one of the voltages and currents corresponding to those generated by induced charges in each of the electrodes such that proximity to a charged target that generates an electric field can be determined.

13. The method of claim 11, further comprising increasing differential gain, corresponding to a difference in induced charge from an external electric field, between the electrodes.

14. The method of claim 11, further comprising isolating charging and discharging of the first electrode and the second electrode.

15. The method of claim 14, wherein isolating charging and discharging comprises using a common electrode.

16. The method of claim 15, further comprising maintaining a substantially equal electric potential between the first electrode, the second electrode and the common electrode.

17. The method of claim 14, further comprising electrically grounding the first and second electrodes to a body to which the first and second electrodes are mounted.

* * * * *